United States Patent [19]

Brownridge

[11] Patent Number: 5,107,161
[45] Date of Patent: Apr. 21, 1992

[54] LOW TEMPERATURE FORCE FIELD PRODUCER

[75] Inventor: James D. Brownridge, Binghamton, N.Y.

[73] Assignee: State University of New York, Albany, N.Y.

[21] Appl. No.: 568,429

[22] Filed: Aug. 16, 1990

Related U.S. Application Data

[63] Continuation-in-part of Ser. No. 153,062, Feb. 8, 1988.

[51] Int. Cl.[5] .............................................. H02N 10/00
[52] U.S. Cl. .......................................... 310/306; 505/1
[58] Field of Search ..................... 310/306, 308, 309; 324/248; 338/325; 505/1

[56] References Cited

U.S. PATENT DOCUMENTS

| | | | |
|---|---|---|---|
| 3,586,439 | 6/1971 | Treharne et al. | 356/43 |
| 3,654,466 | 4/1972 | Abrams et al. | 250/83.3 |
| 3,733,499 | 5/1973 | Deis et al. | 310/306 |
| 3,769,096 | 10/1973 | Ashkin et al. | 136/213 |
| 3,840,748 | 10/1974 | Braunlich | 250/423 |
| 4,634,913 | 1/1987 | Whatmore et al. | 310/313 |
| 4,973,874 | 11/1990 | Carr, Jr. | 310/306 |

OTHER PUBLICATIONS

Bury, "Pyroelectric Properties of Rubidium, Cesium, and Thallium Nitrates," Phys. Stat. Sol. 31, (1969), pp. 799-806.

Schmidt, "Light Emission from TGS", Journal of the Physical Society of Japan, vol. 28, (1970).

Robertson, "Surface Charging of Triglycrine Sulfate", Journal of Applied Physics, vol. 39, No. 6, (1968), pp. 2904-2908.

Sourcebook of Pyroelectricity, (1974), Sidney B. Lang, pp. 28-46 and pp. 68-78 and pp. 167, 177 and 192.

Brown, "Thermal Transformations in Solid $NbNO_3$" Acta Crystallographica (1962) vol. 15, pp. 974-976.

Shamsuzzoha, "Structure of Phase IV $RbNO_3$ at 298 and 403 k" Acta Crystallographica (1962) vol. B38, pp. 2353-2357.

Lucas, "Structure of Phase II $C5NO_3$ at 298k" Acta Crystallographica (1983) vol. C39, pp. 1591-1594.

Primary Examiner—Steven L. Stephan
Assistant Examiner—D. L. Rebsch
Attorney, Agent, or Firm—Robert P. Simpson; Michael L. Dunn; William J. Crosetta, Jr.

[57] ABSTRACT

A process for the formation of a force field comprising cooling at least one crystal selected from potassium tartrate, cesium nitrate, rubidium nitrate, tartaric acid, cadmium nitrate and thorium nitrate to a temperature below about 110K. The force field comprises an electric field and a mass attraction field which maintains its intensity over long time periods. A method is also provided for establishing a force field at a location remote from the cooled crystal by means of an electrical connection to the cooled crystal by an insulated electrical conductor. The invention includes a device for forming the force field.

30 Claims, 1 Drawing Sheet

LOW TEMPERATURE FORCE FIELD PRODUCER

This is a continuation-in-part of application Ser. No. 07/153,062, filed Feb. 8, 1988.

BACKGROUND OF THE INVENTION

In the last several decades there has been increasing interest in the study of pyroelectricity and its utility in environmental detection, laser transmission and the like. By pyroelectricity is meant that property of certain crystals to produce a state of electric polarization by a change in temperature, typically as that temperature is changing.

The phenomenon of pyroelectricity is well described in the literature (e.g. Sidney B. Lang, Sourcebook of Pyroelectricity, Gordon and Breach Science Publishers, New York, 1974). The effect appears to result from the enharmonic ionic vibration of crystals lacking a center of symmetry. Typically, the effect is attained by rapidly increasing or decreasing the temperature of an appropriate crystal, substantially above or below ambient, respectively, which in turn will spontaneously generate a voltage along a polar axis of the crystal. Typically, however, when the temperature of such crystal is then maintained at a constant temperature, even at an extreme of increased or decreased temperature, voltage generation ceases and any voltage which may have been built up immediately dissipates, with the crystal becoming externally electrically neutral.

The utility of pyroelectric crystals in the prior art has generally closely followed the typical aforedescribed experience with the phenomenon. Heat detection, light detection and/or radiation detection, wherein a crystal will be caused to undergo a temperature change by exposure to heat, light and/or radiation, have become the major utilities of pyroelectrics. The voltage generated by a temperature change is measured to quantify heat, light or radiation change. Such utilities are commercially important, but the inability of present pyroelectric crystals to store the voltage generated, together with the typical necessity of, for example, altering the temperature above or below ambient, to achieve an effect in such crystals, has been a severe limitation to their practical application.

SUMMARY OF THE INVENTION

In one aspect, the method of the present invention includes a method of establishing a force field comprising the steps of (a), securing an end of an electrical conductor to a cryogenic field material by means which are electrically conductive, (b) coating that cryogenic field material, including the end of the electrical conductor secured to the cryogenic field material and the electrically conducting means for securing, with an electrically non-conducting means for insulating, (c) coating the other end of the electrical conductor with an electrically non-conducting means for insulating, (d) electrically insulating and, preferably, also structurally protecting, the electrical conductor between both of its ends, and then (e) cooling the cryogenic field material down to a temperature below 273 K. (degrees Kelvin), preferably below 260 K., more preferably below about 110 K.; the force field is established proximate the cryogenic field material and also proximate the end of the electrical conductor which is not secured to the crystal. The force field created by applying the foregoing method is also an aspect of the present invention.

In another aspect, the apparatus of the present invention includes a device for establishing a force field comprising (a) a cryogenic field material, (b) electrically conducting means for securing an end of an electrical conductor, e.g. a wire, to the cryogenic field material, (c) electrically non-conducting means for coating the cryogenic field material and both the end of the electrical conductor and the means for securing, (d) electrically non-conducting means for coating the other end of the electrical conductor, (e) means for electrically insulating and, preferably, also structurally protecting, the electrical conductor between its ends; and (f) means for cooling the cryogenic field material to, and maintaining it at, a temperature below 273 K., preferably below 260 K., more preferably below about 110 K.; the force field is established proximate the cryogenic field material and also proximate the end of the electrical conductor which is not secured to the crystal.

The present invention relates to a process for the formation of a force field, comprising cooling at least one crystal of a cryogenic field material such as those selected from the group comprising $K_2C_4H_4O_6 \cdot xH_2O$, $CsNO_3$, $H_6O_6C_4$, $RbNO_3$, $Cd(NO_3)_2 \cdot xH_2O$, $Th(NO_3)_4 \cdot xH_2O$ and mixtures thereof (wherein $xH_2O$ denotes water of hydration) to temperatures below about 110 K., preferably below about 85 K. The force field of the present invention comprises an electrical field, being a state of electric polarity in the crystals, and further comprises a mass attraction field which attracts various diverse matter. A process is also provided for establishing a force field at a location remote from the cooled crystal by connecting the cooled crystal to an insulated electrical conductor. Means for connecting the insulated electrical conductor are also provided as well as hardware adaptations for practically applying and utilizing the force field.

In accord with the above-identified process a force field device, i.e. a device for establishing a force field, is also provided, comprising at least one cryogenic field material preferably comprising a crystal selected from the group comprising $K_2C_4H_4O_6 \cdot xH_2O$ (potassium tartrate), $CsNO_3$ (cesium nitrate), $H_6O_6C_4$ (tartaric acid), $Cd(NO_3)_2 \cdot xH_2O$ (cadmium nitrate), $RbNO_3$ (rubidium nitrate) and $Th(NO_3)_4 \cdot xH_2O$ (thorium nitrate) or combinations thereof. The force field is established when the device is subjected to and maintained at a temperature preferably below about 260 K., more preferably below about 110 K. Another feature of the device is a provision for means for extending the force field to a location remote from the cooled crystal.

One object of the invention is to provide a process and device for the generation of a force field.

Another object is to provide a device for storing an electric charge.

A further object is to provide a process and device for the generation of a force field capable of attracting mass.

A still further object is to provide a process and device for establishing a force field at a location remote from a cooled crystal via an insulated electrical conductor.

These and other objects of the invention will become apparent from the following recitation of the invention.

DETAILED DESCRIPTION OF THE INVENTION

Figure 1:
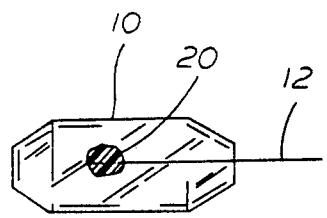
FIG. 1 is a top view of a cryogenic field material, shown in the drawing as a crystal.

The present invention relates to the generation of an electrical phenomenon which has been found to occur upon the cooling of a cryogenic field material, such as crystals of $K_2C_4H_4O_6 \cdot xH_2O$, $CsNO_3$, $H_6O_6C_4$, $Cd(NO_3)_2 \cdot xH_2O$, $RbNO_3$ and $Th(NO_3)_4 \cdot xH_2O$ to temperatures below about 260 K.

Cryogenic field material, as used herein, is a material which, when encapsulated in an electrical insulating substance and introduced into a cryogenic environment, develops a stable polarized field having electrostatic effects. Generally, the stability is maintained for more than about five seconds, preferably more than about a minute and most preferably more than about an hour.

It has been found that when cryogenic field materials such as crystals of $K_2C_4H_4O_6 \cdot xH_2O$, $CsNO_3$, $H_6O_6C_4$, $RbNO_3$, $Cd(NO_3)_2 \cdot xH_2O$ and $Th(NO_3)_4 \cdot xH_2O$ are cooled to temperatures below about 110 K. that two phenomena appear to occur simultaneously. An electric field appears to be spontaneously generated therein, comprising a voltage, with each crystal including a definite positive and negative pole. As the temperature of the crystal is lowered from about 110 K. the field strength increases, typically attaining its maximum strength at below about 78 K.

The spontaneous generation of an electric field, in itself, is not unknown to other crystals but typically, such other crystals require heating from ambient temperature, and when they are temperature stabilized, the electric field immediately, or at least very rapidly, dissipates. In the process of the present invention it has been found that when the environmental temperature is stabilized, the cryogenic field material appears to act as a storage device and remains electrically polarized, without substantial degradation, over long periods of time, typically at least a day and generally more than a week, as long as the environmental temperature is maintained low. By reference to "low environmental temperature" what is meant is a temperature below about room temperature, preferably below about 273 K. and most preferably below about 260 K.

The cryogenic field materials emit light and voltage pulses of high intensity when connected to a voltage measuring instrument. The intensity of the charge and the longevity of the storage in an insulated environment comprise very surprising results. It is speculated that the failure of the electric field to rapidly discharge at low temperatures results from a high electric insulator effect, of the cryogenic field material, which acts to prevent the neutralizing effect of ions and electrons moving between the charged poles.

The second phenomenon which appears to be spontaneously generated with the cooling of the afore-identified cryogenic field material is that of mass attraction. It has been found that co-existent with the formation of an electrical field, during the cooling of these materials in an insulated environment, is the formation of a mass attraction effect by the crystals. Again, the formation of an attractive force by select other crystals is not unknown, but typically such attraction dissipates when the crystal temperature stabilizes. It has been found that when the above-identified crystals have been cooled, as described, that they attract many different types of materials including materials typically not attracted by a magnet. Thus, the crystals appear to have a mass attracting phenomenon which cannot be explained as magnetic attraction. The reason for such attraction is unknown, however, it is believed that it may be related to an induced electrostatic charge, or corona effect, on the polar surfaces of the crystals, caused by the low temperature spontaneous polarization.

It has been found that when crystals of the above-identified cryogenic field material are encapsulated in a suitable electrically non-conductive material, and the device formed therefrom is cooled to the low temperatures mentioned above, that many different materials will be attracted to it as long as the mass attraction field of the device is not discharged or heated above the low temperatures of the invention. For example, a single crystal of $K_2C_4H_4O_6 \cdot \frac{1}{2}H_2O$, $CsNO_3$, $H_6O_6C_4$, $RbNO_3$, $Cd(NO_3)_2 \cdot 4H_2O$ or $Th(NO_3)_4 \cdot 4H_2O$, encapsulated in a non-conductive epoxy and placed in liquid nitrogen at about 78K, develops a stable polarized field which will attract a lead ball many times the weight of such crystal, and the lead ball will cling to the epoxy surface typically for more than about a week, and, in some cases ($CsNO_3$ crystals) even several months or more, not releasing until being physically separated or until the field is discharged. Similarly, ice crystals contained in a liquid nitrogen medium are immediately attracted to and move through the medium to a single crystal of $CsNO_3$ or a segment of polycrystalline $CsNO_3$, both of which are epoxy encapsulated, when either is placed in the medium. In similar tests, iron filings, pieces of copper, Teflon, charcoal, paper, polyvinyl chloride, polyacrylate and glass beads are attracted to charged crystals of the invention in low temperature environment. In each instance, the stable charged state of the crystal maintained itself, at least for more than about 24 hours until being deliberately discharged by the experimenter.

The present invention is not limited to producing a force field proximate the cooled crystal, or even within the cryogenic medium (i.e., cooled area). It has been found experimentally that the force field can also be established at a location remote from the crystal merely by connecting an insulated electrical conductor to the crystal, and then coating the entire crystal with a non-conducting epoxy. The other end of the conductor is desirably connected to a small conducting disk (although the shape of the attached conductor is not critical), which is also coated with a non-conducting epoxy. The disk may be located either within or outside of the cooling medium. When the crystal is cooled according to the process described herein, a force field is found to exist both proximate the crystal, and also proximate the coated disk. In other words, the coated disk will attract small objects, such as paper, plastic, metal, etc. at ambient temperatures, e.g. room temperature.

Thus, the process and device of this invention have multiple utilities in addition to those typically associated with pyroelectrics. The exceptionally high attraction force for other materials can be used to remove undesired elements from low temperature solutions or gases. In the cryogenic environment of outer space, the device can be used to attract particulate or other materials that might otherwise create problems in sensitive instrumentation or low temperature processes. The attractive phenomenon of large and/or multiple crystals directionally focused to large bodies of mass can provide a means of locomotion in a cryogenic space environment. The attractive phenomenon of multiple crystals can comprise a support means for near frictionless travel much as a permanent magnet support means would function, with or without the option of terminating or re-initiating the attractive force. The high intensity of the voltage and light pulse emitted can also be utilized in multiple different applications For example, in a low temperature space environment, the voltage and/or light pulse might be used in lasers, telescopes or a myriad of other devices. Temperature change can be accomplished by alternate shielding and exposure of the crystals to the sun's rays. A fully charged crystal can be shielded from the sun's heat until discharge is desired, then exposed to the sun's rays to increase its temperature and shielded for recharging. Thus, the processes for generating a voltage charge and/or attractive force, with a device of the invention, have multiple uses. On a more mundane level, the attraction force can be applied through not only the disk, but also through insulated pins, probes and other tooling to effect the assembly and repair of microcomponents of, for example, electronic hardware or fine instruments.

Generally, it was found that the size, shape and method of manufacture of the potassium tartrate hydrate, cesium nitrate, rubidium nitrate, tartaric acid, cadmium nitrate hydrate and thorium nitrate hydrate crystals were not critical to the device and process of the present application. Indeed, even partial crystals and ground material were found to create a force field though the intensity of the voltage charge, and the mass attraction force were somewhat less than attainable with larger whole crystals of material. The force field and the intensity of both the voltage changes and the mass attraction forces tends to be greatest at the ends of the crystals, i.e., the electrical poles. (Typically, the "ends" of the crystals are at the extremes of the direction of crystal growth, although not always.) The presence of water of hydration in the potassium tartrate, cadmium nitrate and thorium nitrate can vary greatly within the scope of the present invention. Both the potassium tartrate hemi-and di-hydrate are preferred, along with the cadmium nitrate and thorium nitrate tetra-hydrates.

Generally, crystals can be suitably manufactured by merely preparing a supersaturated aqueous solution of the finely ground material and slowly evaporating off the water over a two to four week period. A preferred method of manufacture is to supersaturate heated water, preferably boiling water, with the material and then cool the aqueous solution to room temperature, in a sealed chamber, over an eight hour or more time period. Another method of manufacture is to melt finely powdered material on a flat surface, which then forms a thin crystalline coating upon cooling. Good results were obtained with several materials using thin pieces of crystalline material obtained by the latter method. Cesium nitrate crystals can be formed merely by slow cooling of the melted material without the use of flat surfaces.

The device of the present application can comprise one or more crystals of the materials of the invention. A mixture of one or more crystals of the present invention can be used or a mixture of one or more crystals of the present invention with one or more crystals of other materials can be used.

The crystalline structure is preferably encapsulated in a non-conductive material such as an epoxy resin or the like, but need not be. On the other hand, it is important to electrically insulate wiring and tooling connected to the crystals to avoid dissipation of the discharge. The poles of the crystal can be electrically wired and multiple crystals can be connected for maximizing the intensity of a discharge. Charging and discharging of the crystals releases both an electric and light pulse. Electric potentials have been measured which are greater than 1,600 Volts across single crystals of various materials. Light pulses from single crystals have been measured with photometric tubes connected to fiber optic cables several meters long.

The following examples are provided to demonstrate the method and device of the present invention and are not meant to define limitations thereof.

EXAMPLE I (A) A super saturated solution was prepared comprising powdered cesium nitrate (99% purity) in water. The water was allowed to slowly evaporate at room temperature and multiple single crystals of $CsNO_3$ were grown and recovered therefrom in about two (2) weeks.

(B) A super saturated solution comprising powdered $RbNO_3$ (99% pure) in water was allowed to slowly evaporate at room temperature and multiple single crystals of $RbNO_3$ were grown and recovered therefrom in about three weeks.

(C) In a similar manner to (A), a super saturated solution of powdered potassium tartrate hemihydrate (99% pure) in water was allowed to slowly evaporate and multiple single crystals of potassium tartrate hemihydrate were recovered.

(D) In a similar manner to (A), a super saturated solution of $Th(NO_3)_4.4H_2O$ (99% pure) in water was allowed to slowly evaporate at room temperature and multiple single crystals of $Th(NO_3)_4.4H_2O$ were recovered.

EXAMPLE II

Powdered cesium nitrate (99% pure) was added to boiling water in an amount sufficient to form a super saturated solution. The solution was slowly cooled to room temperature over a twelve hour period of time. Multiple crystals of $CsNO_3$ were recovered.

EXAMPLE III (A) Powdered rubidium nitrate (99% pure) was oven heated on a glass plate to melting temperature. The melted product was removed from the oven and allowed to cool to room temperature, forming a thin, crystalline sheet.

(B) Powdered cesium nitrate (99% pure) was oven heated on a copper plate to melting temperature. The melted product was removed from the oven and allowed to cool to room temperature forming a thin, crystalline cesium nitrate sheet.

EXAMPLE IV

A cryostat, with viewing window, containing a stainless steel liquid nitrogen coldfinger of approximately four inches in length and one inch in diameter in the internal vacuum chamber was assembled. The coldfinger was bent in an "L" configuration and had attached to its terminal end, a copper wire surrounded by an electrically powered heating element. A temperature monitor was also mounted in the internal chamber, proximate the copper wire, for measuring environmental temperature of the vacuum chamber. A liquid nitrogen reservoir was attached directly to the coldfinger and further comprised a metering device for liquid nitrogen such that the coldfinger could be constantly maintained filled with liquid nitrogen.

A single crystal of $CsNO_3$, prepared in accordance with Example II and measuring approximately $1 \times 2 \times 4$ mm was coated with a non-conductive epoxy and attached to the end of the copper wire extending into the internal chamber from the coldfinger. Pieces of charcoal were placed in the internal chamber of the cryostat, proximate the coated crystal, and the internal chamber was evacuated to about $1 \times 10^{-6}$ torr. Liquid nitrogen was metered into the coldfinger until it was full. The environmental temperature of the internal chamber rapidly moved from ambient to about 78 K. The charcoal was attracted to the crystal and clung thereto. After several hours, the electrically powered heating element was activated. As the temperature of the internal chamber environment moved upward, larger pieces of charcoal dropped off the crystal and at temperatures exceeding about 120 K. all the charcoal had dropped from the crystal. The heating element was turned off, the environmental temperature cooled quickly to about 77 K. and particles of charcoal were again attracted to the crystal. This process of cooling and heating was repeated several times with the same result and no apparent significant loss in attractive field strength of the crystal.

Using the above-identified apparatus and procedure, small pieces of copper, Teflon, polyvinyl chlorine, polyacrylate, iron and glass were placed in the internal chamber and the temperature of the crystal lowered as indicated. In each instance, the diverse materials were attracted to the crystal and dropped off only when the temperature was significantly raised. As was observed with the charcoal pieces, repeated heating and cooling of the crystal resulted in dropping off and re-attaching of the material without apparent significant loss in attractive field strength of the crystal.

EXAMPLE V

Crystals of rubidium nitrate, tartaric acid, potassium tartrate hemihydrate, cadmium nitrate tetrahydrate and thorium nitrate tetrahydrate, prepared in general accord with Example I(B)–(D), were attached to the end of the copper wire of the cryostat described in Example IV. Using the procedure of Example IV, pieces of copper, Teflon, iron, glass and charcoal were alternately placed in the internal chamber of the cryostat and the temperature of the crystal was lowered to about 77 K. as indicated. In each instance, the various diverse materials were attracted to the crystal and dropped off only when the temperature was raised. Repeated heating and cooling of the crystals resulted in dropping off and re-attaching of the diverse materials without apparent significant loss in attractive field strength of the crystals.

EXAMPLE VI

A single crystal of $CsNO_3$ was prepared by the method of Example II having a thickness of 0.7 mm, length 8.0 mm and width 5.0 mm. The crystal weighed 0.0354 grams. The crystal was coated with a non-conductive epoxy and heat cured at about 94° C. The crystal was mounted at the end of a glass rod and lowered into a container of liquid nitrogen, being maintained there until its temperature stabilized at about 77 K. A piece of lead, weighing 6.011 grams, was also placed in the liquid nitrogen proximate the crystal. The lead piece was attracted to the crystal and remained suspended on the crystal as the crystal was moved about in the medium. The lead piece detached when the crystal was removed from the medium and the crystal was allowed to heat up over about 100 K. The lift ratio in the medium was determined to be 170:1 based upon the weight of the crystal and the lead piece.

EXAMPLE VII

A mixture of powdered $RbNO_3$ and $CsNO_3$ was heated to melting in accord with Example III and a thin crystalline sheet of combined material was recovered. A piece of the recovered crystalline sheet was prepared and tested in accord with the Example VI and the lift ratio of lead was determined to be about 257:1 in liquid nitrogen (78 K.).

EXAMPLE VIII

Equal weights of cesium nitrate and potassium tartrate hemihydrate crystals, prepared in accordance with Example I(A) and (C), were crushed to particle size less than about 1.0 mm and mixed together with a non-conductive epoxy to form a circular wafer about 1.0 mm thick and 25.0 mm in diameter. The wafer was suspended in a cryogenic environment and various materials were placed in the environment proximate the wafer. The environmental temperature was reduced to about 77 K. by metering liquid nitrogen therein. The materials were attracted to the wafer and remained suspended therefrom. The environmental temperature was increased and the temperature at which the various materials detached from the wafer was as set out in Table I.

TABLE I

| MATERIAL | WEIGHT | TEMP. OF DETACHMENT (K) |
| --- | --- | --- |
| Aluminum | 4.19 g | 132 |
| Copper (block) | 58.0 g | 104 |
| Aluminum | 36.0 g | 108 |
| Plexiglass | 1.8 g | 260 |
| Copper (disk) | 33.0 g | 105 |
| Copper (sheet) | 2.4 g | 140 |

EXAMPLE IX

The crystal of $CsNO_3$, prepared in accord with Example II, being approximately 15.0 mm long, 2 mm wide and about 0.6 mm thick, was first coated with non-conductive epoxy. Then, to one end of the coated crystal was affixed a conductive silver epoxy coating and a copper wire lead thus forming a capacitive coupling with the crystal. The coated crystal was immersed in liquid nitrogen and voltage pulses were measured from the copper wire lead, using an oscilloscope, having a duration of about 0.25 micro sec at amplitudes up to about 0.3 volts. The intensity of the amplitude, for a capacitive coupling, is surprising.

EXAMPLE X

A crystal of $CsNO_3$, was prepared in accord with Example II, being approximately 15.0 mm long, 2 mm wide and about 0.6 mm thick. At one end thereof, a copper lead wire was connected using silver conductive epoxy. The thus configured crystal was coated with a non-conductive epoxy and immersed in liquid nitrogen. The copper lead wire was connected to one lead of an ammeter with the other lead of the ammeter being connected to ground. The current spontaneously generated in the crystal during cooling was measured. A current intensity of $1.0 \times 10^{-10}$ amperes was measured.

EXAMPLE XI

A crystal of $CsNO_3$ was prepared in accord with Example II, being approximately 15 mm long, 2 mm wide and about 0.6 mm thick. At both ends of the crystal, copper lead wires were connected using conductive silver epoxy. The thus configured crystal was coated with non-conductive epoxy and one copper lead wire was connected to one lead of a resistor of known value. An ammeter was connected to the other lead of the resistor and to the other copper lead from the other side of the crystal. The crystal was immersed in liquid nitrogen and the spontaneously generated voltage of the polarized crystal was calculated to be approximately 1,600 volts.

EXAMPLE XII

A crystal of $CsNO_3$ was prepared in accord with Example II being approximately 15.0 mm long, 2.0 mm wide and 0.6 mm thick. A copper wire was affixed at one end with conductive silver epoxy. The crystal was then coated with non-conductive epoxy and immersed into Liquid Nitrogen. A voltage pulse, measured by an oscilloscope, having a duration of about 0.25 micro second and amplitudes up to about 4.0 volts was emitted.

EXAMPLE XIII

A crystal of $CsNO_3$ was prepared in accord with Example II being approximately 4.0 mm long, 1.0 mm wide and 1.0 mm thick. The crystal was coupled with epoxy to one end of a fiber optic cable approximately 2.0 meters long. The crystal was immersed in liquid nitrogen and a spontaneously generated light pulse was measured at the end of the optic cable with photometric tubes.

EXAMPLE XIV

Figure 2:
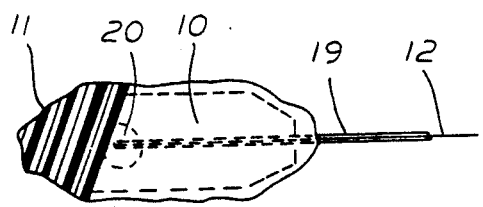
FIG. 2 is a top view of the crystal of FIG. 1, shown connected to an electrical conductor and also showing some of the epoxy insulation removed.
Figure 3:
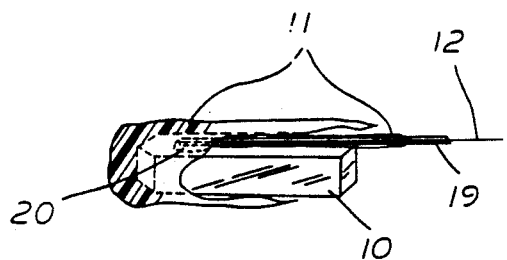
FIG. 3 is a side view similar to FIG. 2
Figure 4:
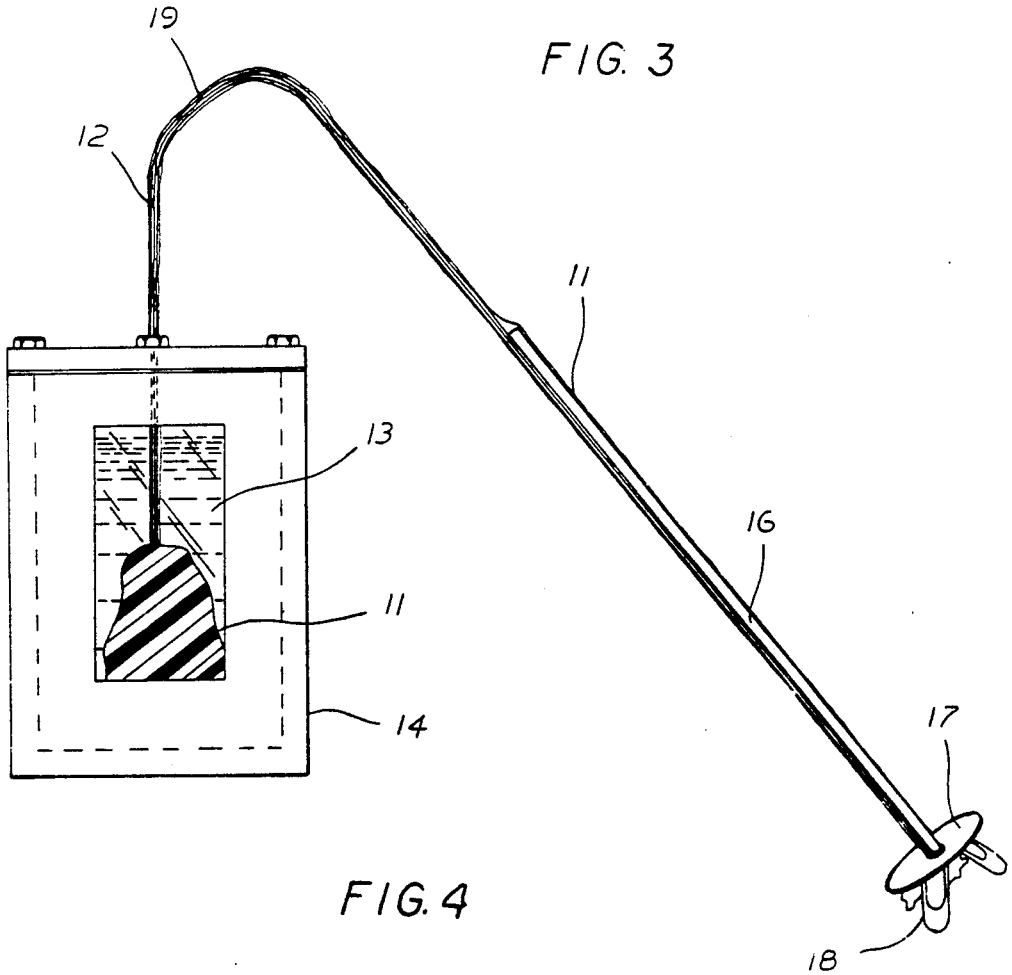
FIG. 4 illustrates the cryogenic crystal immersed in a liquid nitrogen bath and connected to a probe external to the liquid nitrogen.

Single crystals each of potassium tartrate, cesium nitrate, tartaric acid, cadmium nitrate, rubidium nitrate and thorium nitrate were variously formed in accord with the methods described above in Examples I and II. Single crystals were removed from the various growth solutions and placed on soft tissue to dry. The various crystals of each material were then inspected and crystals of each material having sizes of about 2 mm×4 mm×8 mm were selected as test crystals 10. (Reference numerals refer to FIGS. 1, 2, 3 and 4). Each of the test crystals had an end thereof coated with a conductive silver epoxy 20 (A material sold under the tradename "Eccobond Solder 57c" was used). Following this a copper wire 12, wire gauge size 36, was bonded to each of the crystals by the curing of the conductive silver epoxy. In repeating this example, smaller diameter wires were used and all performed satisfactorily. Following the attachment of the copper wire, each of the crystals was completely covered and coated with an electrically non-conductive epoxy 11 (tradename "Eccobond 286") and cured. Then each of the copper wires are covered by a Teflon ® PTFE tube 19, both for electrical insulation and to protect the rather thin and fragile copper wire from breakage in handling. Each of the copper wires was then attached to various forms of probes, each crystal being attached to at least one form or another of probe 16. One probe form used was a piece of copper sheet, 28 gauge, about 0.5 cm². Another form was a needle. Yet another form of probe was a flat circular metal disk 17 of copper having a face area of about 0.5 cm², again using 28 gauge copper sheet. Also, the end of the copper wire, itself, was tried as a probe. The attachment of the copper wire to a probe could be by any conventional method, such as soldering; in all of the crystals of this example, the conductive silver epoxy material was used. Because at least one crystal of each material had a 36 gauge wire and a metal disk form of probe attached to it, in this example, the following discussion relates specifically thereto as well as generally to the behavior of all of the other crystals of this example, as well. After the probes were attached to the copper wires (covered with PTFE), the probes, like the crystals, were covered and coated with the electrically non-conductive epoxy 11. The crystal/wire/probe assemblies were then ready for use.

Each of the assemblies was immersed in liquid nitrogen 13 in cryostat 14, with the probes extending into the ambient atmosphere at room temperature, and within a few seconds the attraction force was operative vis-a-vis the probes, i.e., various items could be attracted to the probes. The temperature of the crystals in the liquid nitrogen was observed to be 77 K.–78 K. The probes could all attract and hold aluminum foil, about 1.0 cm², aluminum filings, potassium chloride crystals, paper pieces and small paper objects, as well as various types of plastic material, e.g., PTFE, PVC, polyacrylate, polyethylene, etc. and also glass beads and small pieces of glass (represented by numeral 18 in FIG. 4). Ferrous metal objects, such as pins, paper clips, staples, etc. were readily attracted. The holding tenacity of the probes all exceeded 3 hours; none of the samples of any of the foregoing materials fell off of any of the probes, during that 3 hour test, as long as the crystals were continuously maintained in the liquid nitrogen.

Some variations were tried. The electrically non-conductive coating was scratched off of a few of the probes and the attraction force was tested. Firstly, the degree of attraction seemed, initially, to be significantly less and, secondly, it was dissipated to virtually nothing within seconds of coming into contact with any other conductor or semi-conductor. It took a few more seconds, but the attraction force, likewise, dissipated to virtually nothing in contact with paper, glass and plastic, all relative non-conductors.

In regard to various of the assemblies, the attraction force could be intentionally disrupted by simply grounding the copper wire. When this was done, and the attached crystal removed from the liquid nitrogen and brought up to room temperature, re-immersion of the crystal back into the liquid nitrogen, would, in all cases and within just a few seconds, completely and fully regenerate the attraction force. It was noted, however, that if the protective seal of the epoxy surrounding the crystal is broken, and moisture gets to the crystal, the crystal gradually looses all of the properties described herein and cannot be regenerated by withdrawal from the liquid nitrogen and reimmersion therein from room temperature.

After 3 hours of holding the various test materials, each of those materials was pulled from its probe to see if it could be reattracted to that same probe; in all cases, each was reattracted with seemingly the same degree of force as in the initial attraction. In comparing the various sample test materials, it was subjectively observed that the greater the degree of conductivity (lower resistivity) a material had, the greater the affinity of the attractive force for it. This is to say that all of the probes tended to attract metal objects from a greater distance, with more force, and with greater holding power, than that which was exhibited for, e.g. plastic, glass or paper.

Varying the location of the wire attachment was tried on $CsNO_3$ crystals. A copper wire was attached to the side of the crystal, as distinguished from being attached at the end. It was observed that the degree of attraction force seemed to be substantially reduced when the wire attachment was not at the end. This was even true when the surface area of the wire-silver epoxy contact area on the end attachment was reduced by one-half; in this situation the attraction force of the end-attached wire assembly was still observed to be greater in comparison to that of an assembly wherein the attachment of the wire was to the side of the crystal. It should be explained that the "side" of the $CsNO_3$ crystal is any face of the crystal which is parallel and aligned with the direction of growth of the crystal, in this case, a face which is vertical, as distinguished from horizontal, in the position in which the crystal was originally grown. In this example; conversely any face is an "end" face which is generally perpendicular to a "side" face.

Although the invention has been described in considerable detail with respect to the preferred embodiment thereof, it will be apparent that the invention is capable of numerous modifications and variations to those skilled in the art, without departing from the spirit and scope of the invention as defined in the appended claims which are hereby included by this reference in this specification.

What is claimed is:

1. A method of establishing a force field, comprising:
   a) securing a first end of an electrical conductor, by electrically conductive means, to a cryogenic field material;
   b) coating said cryogenic field material, said first end of an electrical conductor and said electrically conductive means for securing, with an electrically non-conducting means for insulating;
   c) coating a second end of said electrical conductor with an electrically non-conducting means for insulating;
   d) electrically insulating and structurally protecting said electrical conductor between said first and said second ends; and
   e) cooling said cryogenic field material to, and maintaining said cryogenic field material at, a temperature below about 110 K., wherein said force field is established proximate said cryogenic field material and also proximate said second end of the electrical conductor.

2. A method of establishing a force field as recited in claim 1 wherein said first end of said conductor is cooled to a temperature below about 110 K. and said second end of said conductor is maintained at approximately ambient temperature, where ambient temperature is defined as the temperature of said conductor prior to cooling.

3. The method of claim 1 wherein the force field comprises an electric field.

4. The method of claim 1 wherein the force field comprises a mass attraction field.

5. The method of claim 1 wherein said cryogenic field material is selected from the group comprising potassium tartrate, cesium nitrate, tartaric acid, cadmium nitrate, rubidium nitrate, thorium nitrate or combinations thereof.

6. The method of claim 1 wherein the cryogenic field material maintains a stable polarized field for more than about 5 seconds.

7. The method of claim 6 wherein a stabilized field is maintained for more than about one hour.

8. The method of claim 7 wherein a stabilized field is maintained for more than about a week.

9. The method of claim 1 wherein said cryogenic field material is a crystal selected from a hydrate of potassium tartrate, cadmium nitrate and thorium nitrate.

10. The method of claim 9 wherein said crystal is selected from potassium tartrate hemihydrate, potassium tartrate dihydrate, cadmium nitrate tetrahydrate and thorium nitrate tetrahydrate.

11. The method of claim 9 wherein said force field comprises at least one of electric and mass attraction force fields.

12. The method of claim 11 wherein said temperature is below about 85 K.

13. The method of claim 11 wherein the force field comprising cryogenic field material is maintained at low temperature.

14. The method of claim 1 wherein said cryogenic field material is a crystal selected from cesium nitrate, rubidium nitrate and tartaric acid.

15. The method of claim 14 wherein said force field comprises at least one of electric and mass attraction force fields.

16. The method of claim 14 wherein said temperature is below about 85 K.

17. The method of claim 15 wherein the force field comprising cryogenic material is maintained at low temperature.

18. The method of claim 1 wherein the temperature is below about 85 K.

19. The method of claim 1 wherein the force field comprising cryogenic material is maintained at low temperature.

20. A force field established by the method of claim 1.

21. A device for establishing a force field, comprising:
   a) a cryogenic field material;
   b) electrically conducting means for securing a first end of an electrical conductor to said cryogenic field material;
   c) electrically non-conducting means for coating said cryogenic field material, said first end and said means for securing;
   d) electrically non-conducting means for coating a second end of said electrical conductor;
   e) means for electrically insulating and structurally protecting said electrical conductor between said first and second ends; and
   f) means for cooling said cryogenic field material to a temperature below about 110 K., wherein said force field is established proximate said cryogenic field material and also proximate said second end of said electrical conductor.

22. A device as recited in claim 21 wherein said first end of said conductor is cooled to a temperature below about 110 K. and said second end of said conductor is maintained at approximately ambient temperature, where ambient temperature is defined as the temperature of said conductor prior to cooling.

23. A device as recited in claim 21 wherein said cryogenic field material is a crystal selected from the group comprising cesium nitrate, rubidium nitrate, tartaric acid, a hydrate of potassium tartrate, cadmium nitrate or thorium nitrate or mixtures thereof.

24. A device as recited in claim 21 wherein said cryogenic field material is selected from the group comprising potassium tartrate, cesium nitrate, tartaric acid, cadmium nitrate, rubidium nitrate, thorium nitrate or combinations thereof.

25. A device as recited in claim 21 wherein said cryogenic field material maintains a stable polarized field for more than about 5 seconds.

26. A device as recited in claim 25 wherein said stable polarized field is maintained for more than about one minute.

27. A device as recited in claim 25 wherein said stable polarized field is maintained for more than about an hour.

28. A device as recited in claim 25 wherein said stable polarized field is maintained for more than about 3 hours.

29. A device as recited in claim 25 wherein said stable polarized field is maintained for more than about a day.

30. A device as recited in claim 25 wherein said stable polarized field is maintained for more than about a week.

* * * * *